(12) United States Patent
Schultz et al.

(10) Patent No.: US 9,842,724 B2
(45) Date of Patent: Dec. 12, 2017

(54) METHOD AND SYSTEM FOR IMAGING OF A PHOTOMASK THROUGH A PELLICLE

(71) Applicant: KLA-Tencor Corporation, Milpitas, CA (US)

(72) Inventors: William G. Schultz, San Jose, CA (US); Gildardo Delgado, Livermore, CA (US); Garry A. Rose, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/012,599

(22) Filed: Feb. 1, 2016

(65) Prior Publication Data

US 2016/0225582 A1 Aug. 4, 2016

Related U.S. Application Data

(60) Provisional application No. 62/111,413, filed on Feb. 3, 2015.

(51) Int. Cl.
*H01J 37/28* (2006.01)
*G03F 1/62* (2012.01)
*G03F 1/86* (2012.01)

(52) U.S. Cl.
CPC ............ *H01J 37/28* (2013.01); *G03F 1/62* (2013.01); *G03F 1/86* (2013.01); *H01J 2237/2817* (2013.01)

(58) Field of Classification Search
CPC ...... G03F 1/86; H01J 37/28; H01J 2237/2003
See application file for complete search history.

(56) References Cited

U.S. PATENT DOCUMENTS

| | | | |
|---|---|---|---|
| 4,897,545 A | * | 1/1990 | Danilatos .............. H01J 37/244 250/310 |
| 4,992,662 A | | 2/1991 | Danilatos |
| 5,362,964 A | | 11/1994 | Knowles et al. |

(Continued)

FOREIGN PATENT DOCUMENTS

| | | |
|---|---|---|
| JP | 2009238426 A | 10/2009 |
| WO | 2009083606 A1 | 7/2009 |

OTHER PUBLICATIONS

KM Abramovich et al., Defect Analyses Using a Clear Mask with a Pellicle, IBM Research Disclosure n289 05-88, May 1, 1988, 2 pages.

(Continued)

*Primary Examiner* — Wyatt Stoffa
*Assistant Examiner* — Eliza Osenbaugh-Stewart
(74) *Attorney, Agent, or Firm* — Suiter Swantz pc llo (57) ABSTRACT

A system for imaging a sample through a protective pellicle is disclosed. The system includes an electron beam source configured to generate an electron beam and a sample stage configured to secure a sample and a pellicle, wherein the pellicle is disposed above the sample. The system also includes an electron-optical column including a set of electron-optical elements to direct at least a portion of the electron beam through the pellicle and onto a portion of the sample. In addition, the system includes a detector assembly positioned above the pellicle and configured to detect electrons emanating from the surface of the sample.

26 Claims, 10 Drawing Sheets

(56) References Cited

U.S. PATENT DOCUMENTS

| | | | |
|---|---|---|---|
| 5,466,936 A * | 11/1995 | Kohama | H01J 37/244 250/310 |
| 5,888,327 A | 3/1999 | Akagawa et al. | |
| 6,192,100 B1 * | 2/2001 | Acosta | G03F 1/22 378/34 |
| 6,264,773 B1 | 7/2001 | Cerio | |
| 6,500,588 B2 | 12/2002 | Williams | |
| 6,703,172 B2 | 3/2004 | Fujita et al. | |
| 6,829,035 B2 | 12/2004 | Yogev | |
| 7,443,486 B2 | 10/2008 | Van Ingen Schenau et al. | |
| 7,556,896 B2 | 7/2009 | Fukuhara et al. | |
| 7,974,802 B2 | 7/2011 | Badger et al. | |
| 8,479,125 B2 | 7/2013 | Pierrat | |
| 2008/0283747 A1 * | 11/2008 | Kawamata | H01J 37/265 250/310 |
| 2008/0315094 A1 * | 12/2008 | Wang | H01J 37/244 250/310 |
| 2009/0230304 A1 | 9/2009 | Hatano et al. | |
| 2011/0133083 A1 | 6/2011 | Beirhoff et al. | |
| 2011/0210247 A1 | 9/2011 | Shachal et al. | |
| 2014/0036243 A1 | 2/2014 | Beyer et al. | |
| 2014/0312226 A1 | 10/2014 | Boughorbel et al. | |
| 2015/0028203 A1 * | 1/2015 | Litman | G03F 1/86 250/307 |
| 2015/0255244 A1 * | 9/2015 | Ominami | H01J 37/16 250/307 |
| 2015/0311033 A1 * | 10/2015 | Ominami | H01J 37/16 250/307 |

OTHER PUBLICATIONS

IBM, Method for Correction of Out of Plane Distortion in Photomasks Using Pellicle Frame Distortion, Jan. 13, 2009, 3 pages.

DW Fisher et al., Transparent Ring for Low Angle Pellicle Inspection, Disclosure No. TDB 07-80 p. 526, Jul. 1, 1980, 2 pages.

PCT Search Report for International Application No. PCT/US2016/016312, dated May 20, 2016, 4 pages.

\* cited by examiner

METHOD AND SYSTEM FOR IMAGING OF A PHOTOMASK THROUGH A PELLICLE

CROSS-REFERENCE TO RELATED APPLICATION

The present application claims benefit under 35 U.S.C. §119(e) and constitutes a regular (non-provisional) patent application of U.S. Provisional Application Ser. No. 62/111,413, filed Feb. 3, 2015, entitled POSSIBLE MEANS OF SEM IMAGING OF PHOTOMASKS THROUGH A PELLICLE, naming William George Schultz, Gildardo Rio Delgado and Garry Allen Rose as inventors, which is incorporated herein by reference in the entirety.

TECHNICAL FIELD

The present invention generally relates to scanning electron microscopy, and, in particular, a scanning electron microscopy system for imaging a photomask through a pellicle.

BACKGROUND

Fabricating semiconductor devices such as logic and memory devices typically includes processing a substrate such as a semiconductor wafer using a large number of semiconductor fabrication processes to form various features and multiple levels of the semiconductor devices. As semiconductor device size become smaller and smaller, it becomes critical to develop enhanced photomask inspection and review devices and procedures.

Actinic and non-actinic optical microscopy and standard E-beam inspection systems have been used to inspect photomasks. Conventional secondary electron detectors include, but are not limited to, an Everhart-Thornley detector, a multichannel plate, a PIN detector, an avalanche diode, or APD. These detectors typically allow for the imaging of low energy secondary electrons from a metallic or hybrid semiconductor/metallic surface. However, the implementation of a protective and conductive pellicle film, positioned above the given photomask, has severely limited the ability of these conventional imaging approaches to image the photomask. Further, photomasks used in extreme ultraviolet (EUV) lithography require detection of defect particles as small as 10 nm in diameter, which further limits the usefulness of conventional electron imaging approaches in inspection of EUV-based photomasks.

As such, it would be advantageous to provide a system and method that provides improved electron imaging of photomasks through a protective pellicle so as to remedy the shortcomings of the conventional approaches identified above.

SUMMARY

A scanning electron microscopy (SEM) apparatus is disclosed, in accordance with one or more embodiments of the present disclosure. In one illustrative embodiment, the SEM apparatus includes an electron beam source configured to generate an electron beam. In another illustrative embodiment, the SEM apparatus includes a sample stage configured to secure a sample and a pellicle, wherein the pellicle is disposed above the sample. In another illustrative embodiment, the SEM apparatus includes an electron-optical column including a set of electron-optical elements to direct at least a portion of the electron beam through the pellicle and onto a portion of the sample. In another illustrative embodiment, the SEM apparatus includes a detector assembly positioned above the pellicle and configured to detect electrons emanating from the surface of the sample.

A scanning electron microscopy (SEM) apparatus is disclosed, in accordance with one or more embodiments of the present disclosure. In one illustrative embodiment, the SEM apparatus includes an electron beam source configured to generate an electron beam. In another illustrative embodiment, the SEM apparatus includes a sample stage configured to secure a sample and a pellicle, wherein the pellicle is disposed above the sample and a selected gas is contained within the volume between the pellicle and the photomask at a selected pressure. In another illustrative embodiment, the SEM apparatus includes an electron-optical column including a set of electron-optical elements to direct at least a portion of the electron beam through the pellicle and onto a portion of the sample. In another illustrative embodiment, the selected gas amplifies electrons emanating from the surface of the sample.

A method for imaging a sample through a pellicle is disclosed, in accordance with one or more embodiments of the present disclosure. In one illustrative embodiment, the method includes generating an electron beam. In another illustrative embodiment, the method includes directing the electron beam through a pellicle onto a surface of a sample. In another illustrative embodiment, the method includes detecting at least one of backscattered electrons scattered from the surface of the sample, secondary electrons emitted from the surface of the sample, or photons emitted by electron-gas interactions within a pressurized gas between the pellicle and the sample.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings. Referring generally to FIGS. 1A through 1K, a system and method for imaging a photomask is described in accordance with the present disclosure. Embodiments of the present disclosure are directed to a scanning electron microscopy (SEM) system capable of imaging a photomask through a pellicle positioned to protect the underlying photomask. Embodiments of the present disclosure are directed to the collection of backscattered electrons scattered from the surface of the photomask and transmitted through the pellicle. Additional embodiments of the present disclosure are directed to the collection of secondary electrons emitted by the photomask and transmitted through the pellicle. Additional embodiments of the present disclosure are directed to the collection of secondary electrons resulting from the amplification of initial "weak" secondary electrons by a pressurized gas medium and/or the collection of photons resulting from gas-electron interactions within the pressurized gas medium.

The system 100 may be used to inspect and/or review any sample known in the art of scanning electron microscopy. For example, the sample may include any photomask known in the art, such as, but not limited to, EUV multilayer (ML) photomask or an X-ray photomask. For instance, an EUV ML photomask may include, but is not limited to, a Mo/Si multilayer reflective mask.

It is noted that while the system and method of the present disclosure are discussed in the context of photomask inspection/review this should not be interpreted as a limitation on the scope of the present disclosure. It is recognized herein that the embodiments of the present disclosure may be extended to image any type of sample through any type of protective element, such as, but not limited to, a pellicle. For example, embodiments of the present disclosure may be adapted to perform inspection and/or defect review on a wafer (e.g., semiconductor wafer) that is protected by a pellicle, membrane or film.

Embodiments of the present disclosure may image one or more portions of a photomask through an overlying pellicle using information gathered from the collected backscattered electrons, secondary electrons and/or photons. Based on the imaging of the surface of the photomask, embodiments of the present disclosure may identify defects present on the surface of the photomask. In the case of EUV ML masks, such defects include, but are not limited to, phase defects, absorber pattern defects and haze formation. ML phase defects are primarily caused by the inclusion of defects on the substrate during ML deposition of the substrate. Even a few nanometer height differences on the ML mask may cause a printable phase defect because of the short wavelength of 13.5 nm utilized in EUV lithography. Haze formation is commonly caused by ammonium salts (e.g., ammonium sulfate, ammonium nitrates, ammonium phosphates, ammonium oxalate), organics and siloxanes film growth. Haze formation occurs at preferential sites on photomask and is often material and structure dependent.

Embodiments of the present disclosure utilize a conductive pellicle and/or a conductive photomask as electron optical elements of system 100, which aids in defect review by applying electrical charges to the pellicle and/or photomask. By establishing a negative charge on the pellicle it is possible to establish a retarding field, which decelerates primary beam electrons before impinging on the photomask surface. In addition, the pellicle may be positively charged to accelerate secondary electrons emitted by the surface of the photomask. Further, the charge on the photomask may be controlled in order to control the landing energy of electrons incident on the photomask. These features are discussed in greater detail further herein.

FIGS. 1A-1D illustrate system 100 arranged for imaging a photomask protected by a pellicle via the collection of backscattered electrons, in accordance with one embodiment of the present disclosure.

Figure 1A:
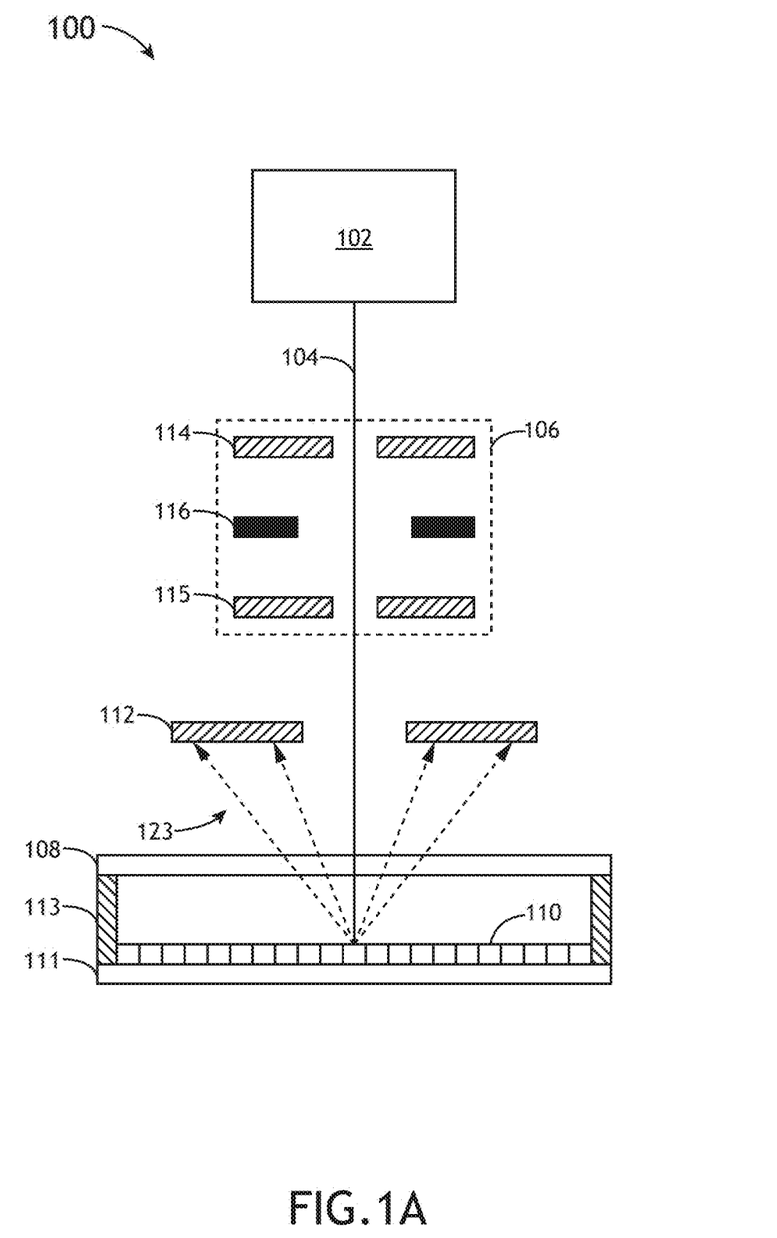
FIG. 1A is a high level schematic illustration of a system for imaging a photomask through a protective pellicle via the collection of backscattered electrons, in accordance with one embodiment of the present disclosure.

In one embodiment, the system 100 includes an electron beam source 102 for generating one or more electron beams 104. The electron beam source 102 may include any electron source known in the art. For example, the electron beam source 102 may include, but is not limited to, one or more electron guns. For instance, the electron beam source 102 may include a single electron gun for generating a single electron beam 104. In another instance, the electron beam source 102 may include multiple electron guns for generating multiple electron beams 104. For example, the energy of the electron beam formed by the electron beam source 102 may be between 1 and 20 kV. It is noted that the energy of the beam 104 is not limited to 1-20 kV, which is provided merely for illustrative purposes. It is recognized herein that the energy of the primary beam 104 may reach 200 kV.

In another embodiment, the system 100 includes a sample stage 111. The sample stage 111 secures the photomask 110 and the pellicle 108. It is noted that the pellicle 108 is disposed above the photomask 110. In one embodiment, the pellicle 108 is secured above the photomask 110 with frame 113. As discussed further herein, the pellicle 108 and photomask 110 may be electrically isolated from one another (and the rest of the system), allowing for biasing of the pellicle 108 and photomask 110 relative to one another. It is noted that the terms "above" and "below," as used throughout the present disclosure, are used for purposes of simplicity only and are not meant to be interpreted as a limitation on the present disclosure.

In another embodiment, the sample stage 111 is an actuatable stage. For example, the sample stage 111 may include, but is not limited to, one or more translational stages suitable for selectably translating the photomask 110 along one or more linear directions (e.g., x-direction, y-direction and/or z-direction). By way of another example, the sample stage 111 may include, but is not limited to, one or more rotational stages suitable for selectably rotating the photomask 110 along a rotational direction. By way of another example, the sample stage 111 may include, but is not limited to, a rotational stage and a translational stage suitable for selectably translating the sample along a linear direction and/or rotating the photomask 110 along a rotational direction.

In another embodiment, the system 100 includes an electron-optical column 106. The electron-optical column 106 may include a set of electron-optical elements. The set of electron-optical elements may direct at least a portion of the electron beam 104 through the pellicle 108 and onto a selected portion of the photomask 110. The set of electron-optical elements of the electron-optical column 106 may include any electron-optical elements known in the art suitable for focusing and/or directing the electron beam 104 through the pellicle 108 and onto a selected portion of the photomask 110. In one embodiment, the set of electron-optical elements includes one or more electron-optical lenses. For example, the electron-optical lenses may include, but are not limited to, one or more condenser lenses 114 for collecting electrons from the electron beam source 102. By way of another example, the electron-optical lenses may include, but are not limited to, one or more objective lenses 115 for focusing the electron beam 104 onto a selected region of the photomask 110.

For purposes of simplicity a single electron-optical column 106 is depicted in FIG. 1A. It is noted herein that this configuration should not be interpreted as a limitation on the present disclosure. For example, the system 100 may include multiple electron-optical columns 106.

In another embodiment, the set of electron-optical elements of the electron-optical column 106 includes one or more electron beam scanning elements 116. For example, the one or more electron beam scanning elements 116 may include, but are not limited to, one or more electromagnetic scanning coils or electrostatic deflectors suitable for controlling a position of the beam 104 relative to the surface of the photomask 110. In this regard, the one or more scanning elements 116 may be utilized to scan the electron beam 104 across the photomask 110 in a selected pattern.

Figure 1B:
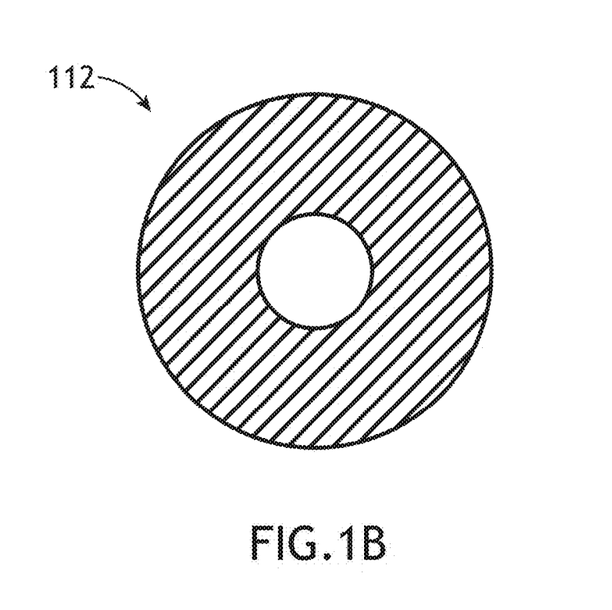
FIG. 1B is a top view of a backscattered electron detector, in accordance with one embodiment of the present disclosure.
Figure 1C:
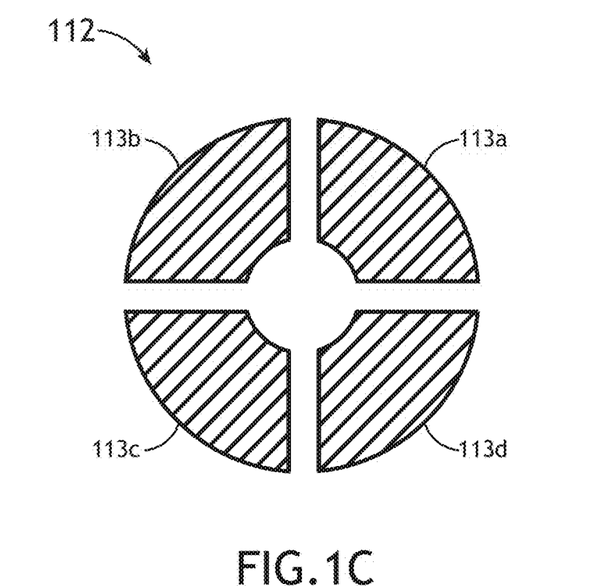
FIG. 1C is a top view of a backscattered electron quad detector, in accordance with one embodiment of the present disclosure.
Figure 1D:
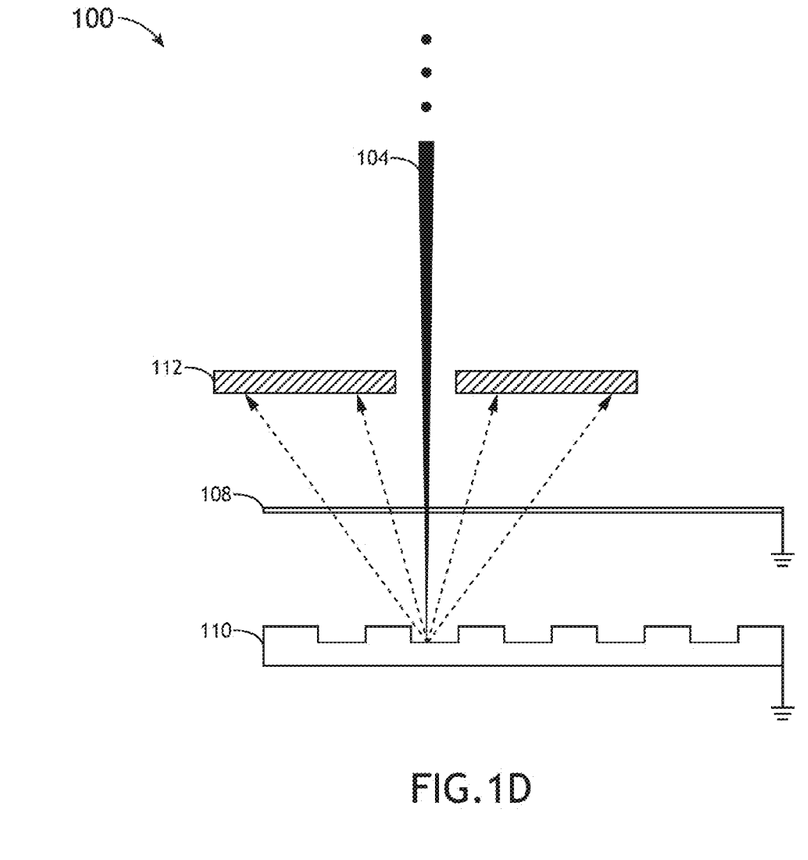
FIG. 1D is a high level schematic illustration of a system for imaging a photomask through a protective pellicle via the collection of backscattered electrons, in accordance with one embodiment of the present invention.

In another embodiment, the system 100 includes a backscattered electron detector assembly 112. The backscattered electron detector assembly 112 may include any detector technology known in the art capable of detecting backscattered electrons. For example, the backscattered electron detector assembly 112 may be positioned below the electron-optical column 106 and above the pellicle 108. In one embodiment, as shown in FIG. 1B, the detector assembly 112 may include a single annular backscattered electron detector. In another embodiment, as shown in FIG. 1C, the detector assembly 112 may include a multi-element annular backscattered electron detector. For example, as shown in FIG. 1C, the detector assembly 112 includes, but is not limited to, a backscattered electron quad array including elements 113a-113d. It is noted that the use of an array of backscattered electron detectors (e.g., quad detector in FIG. 1C) allows for the determination of topography and/or composition of the photomask 110.

It is noted that the backscattered electron detector assembly 112 may include any type of backscattered electron detector known in the art. In one embodiment, backscattered electrons may be collected and imaged using a Everhart-Thornley detector (or other type of scintillator-based detector). In another embodiment, backscattered electrons may be collected and imaged using a micro-channel plate (MCP). In another embodiment, backscattered electrons may be collected and imaged using PIN or p-n junction detector, such as a diode or a diode array. In another embodiment, backscattered electrons may be collected and imaged using one or more avalanche photo diodes (APDs).

It is noted herein that the system 100 may operate in any scanning mode known in the art. For example, the system 100 may operate in a swathing mode when scanning an electron beam 104 across the surface of the photomask 110. In this regard, the system 100 may scan an electron beam 104 across the photomask 110, while the sample is moving, with the direction of scanning being nominally perpendicular to the direction of the sample motion. By way of another example, the system 100 may operate in a step-and-scan mode when scanning an electron beam 104 across the surface of the photomask 110. In this regard, the system 100 may scan an electron beam 104 across the photomask 110, which is nominally stationary when the beam 104 is being scanned.

The system 100 may extract surface defect data from a photomask 110 using a high beam energy electron beam 104 from the electron beam source 102 that penetrates the pellicle film 108 and continues to the surface of the photomask 110. These electrons will elastically collide with nuclei of the photomask material and backscatter from the surface of the photomask 110. The backscattered electron (BSE) signal emerges from within the bulk of the surface of the photomask 110 with a given distribution (e.g., a cosine distribution). It is noted that BSE imaging may display a hard resolution limit related to the beam energy and the target material. However, the high energy backscattered electron signal, emerging from deep within the photomask surface, may be sufficiently energetic to traverse the pellicle 108 to a detector assembly 112 located elsewhere within the system 100.

In another embodiment, the various components of system 100 are disposed within a vacuum chamber (not shown). In order to avoid damage or contamination of the photomask 110 all vacuum system components, electrical and mechanical feedthroughs, connectors and cable/wire assemblies for the system 100 are constructed from approved materials. Materials that may prove problematic in the vacuum system include, but are not limited to, Hg, Tl, Se, Te, Cd, Au, Ag, In, Zn, Sn, Pb, S, Silicon oils and greases and Silicon based adhesives and epoxies. In addition, commonly used polymer (plastics) and elastomer materials such as, but not limited to, neoprene, adaprene, urethane, polyurethane, polyester, silicone, polypropylene, polystyrene, polyethylene, nylon, polycarbonates, polyolefins and Molybdenum disulfide (MoS2) should be avoided or at least well regulated. Any problematic materials should be enclosed so they do not outgas, eject particles or adversely interact with the electron beam.

Figure 1E:
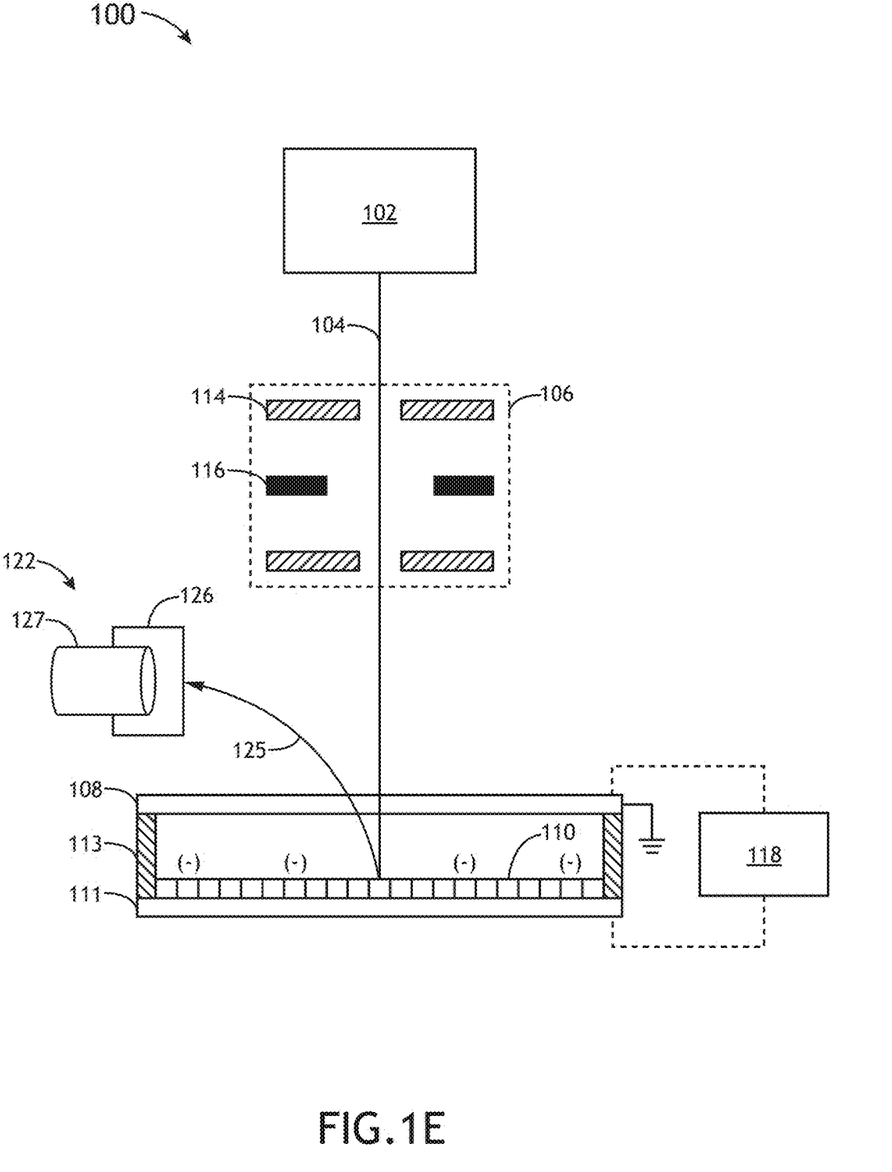
FIG. 1E is a high level schematic illustration of a system for imaging a photomask through a protective pellicle via the collection of secondary electrons with an Everhart-Thornley secondary electron detector, in accordance with one embodiment of the present disclosure.
Figure 1F:
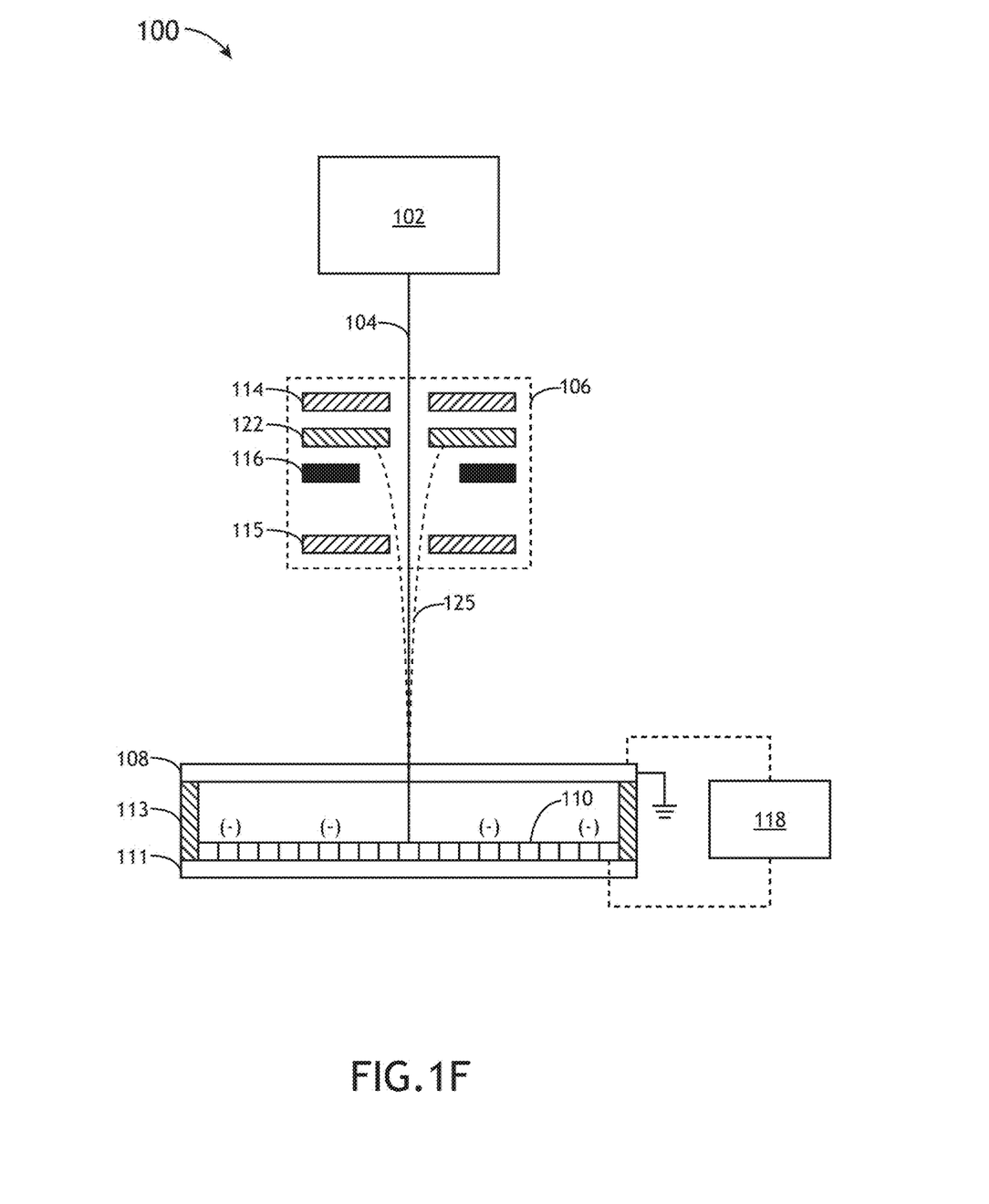
FIG. 1F is a high level schematic illustration of a system for imaging a photomask through a protective pellicle via the collection of secondary electrons with an in-column secondary electron detector, in accordance with one embodiment of the present disclosure.

FIGS. 1E-1F illustrate system 100 configured for imaging a photomask protected by a pellicle via the collection of secondary electrons, in accordance with an additional embodiment of the present disclosure. It is noted herein that the various examples and embodiments described previously herein with respect to FIGS. 1A-1D should be interpreted to extend to the embodiments of FIGS. 1E-1F unless otherwise noted. In one embodiment, the system 100 includes a secondary electron detector assembly 122. The secondary electron detector assembly 122 may include any detector technology known in the art capable of detecting secondary electrons. For example, as shown in FIG. 1E, the secondary electron detector assembly 122 may include, but is not limited to, an Everhart-Thornley detector. For instance, the detector assembly 122 may include an electron collector 126 (e.g., secondary electron collector), which may be biased to collect secondary electrons 125 emitted by the surface of the photomask 110. Further, the detector assembly 122 includes a detector element 127 (e.g., scintillating element and PMT detector) for detecting electrons 125 from the photomask surface. By way of another example, as shown in FIG. 1F, the secondary electron detector assembly 122 may include, but is not limited to, an in-column detector. For instance, the detector assembly 122 may include a secondary electron detector disposed within the electron-optical column 106. By way of another example, the secondary electron detector may include, but is not limited to, a multi-channel electron multiplier. By way of another example, the secondary electron detector may include, but is not limited to, one or more PIN diodes or one or more avalanche photodiodes (APDs).

In another embodiment, a retarding voltage is established between the pellicle 108 and the photomask 110. In one embodiment, the retarding voltage is established by negatively biasing the photomask 110 relative to the pellicle 108. For example, the pellicle 108 may be grounded, with the photomask 110 held at a negative potential. For example, as shown in FIGS. 1E and 1F, the system 100 includes bias control circuitry 118. The bias control circuitry 118 may connect the pellicle 108 to ground, while establishing a negative potential on the photomask 110 (e.g., via a voltage source). In one embodiment, the bias control circuitry 118 is integrated with the sample stage 111 to establish one or more electrical connections between the sample stage 111 and the pellicle 108 and/or photomask 110 in order to ground the pellicle 108, while providing a negative potential to the photomask 110 (e.g., via a voltage source).

In one embodiment, the retarding voltage serves to decelerate electrons in the beam 104 when impacting the surface of the photomask 110. The deceleration of electrons incident on the photomask surface increases the sensitivity of the system 100 to smaller surface detail. In turn, when secondary electrons 125 are emitted by the photomask 110 they are accelerated back to the pellicle 108 with sufficient voltage to penetrate and traverse the pellicle 108. Next, once the secondary electrons 125 emerge from the pellicle 108, they are collected by the detector assembly 112.

Figure 1G:
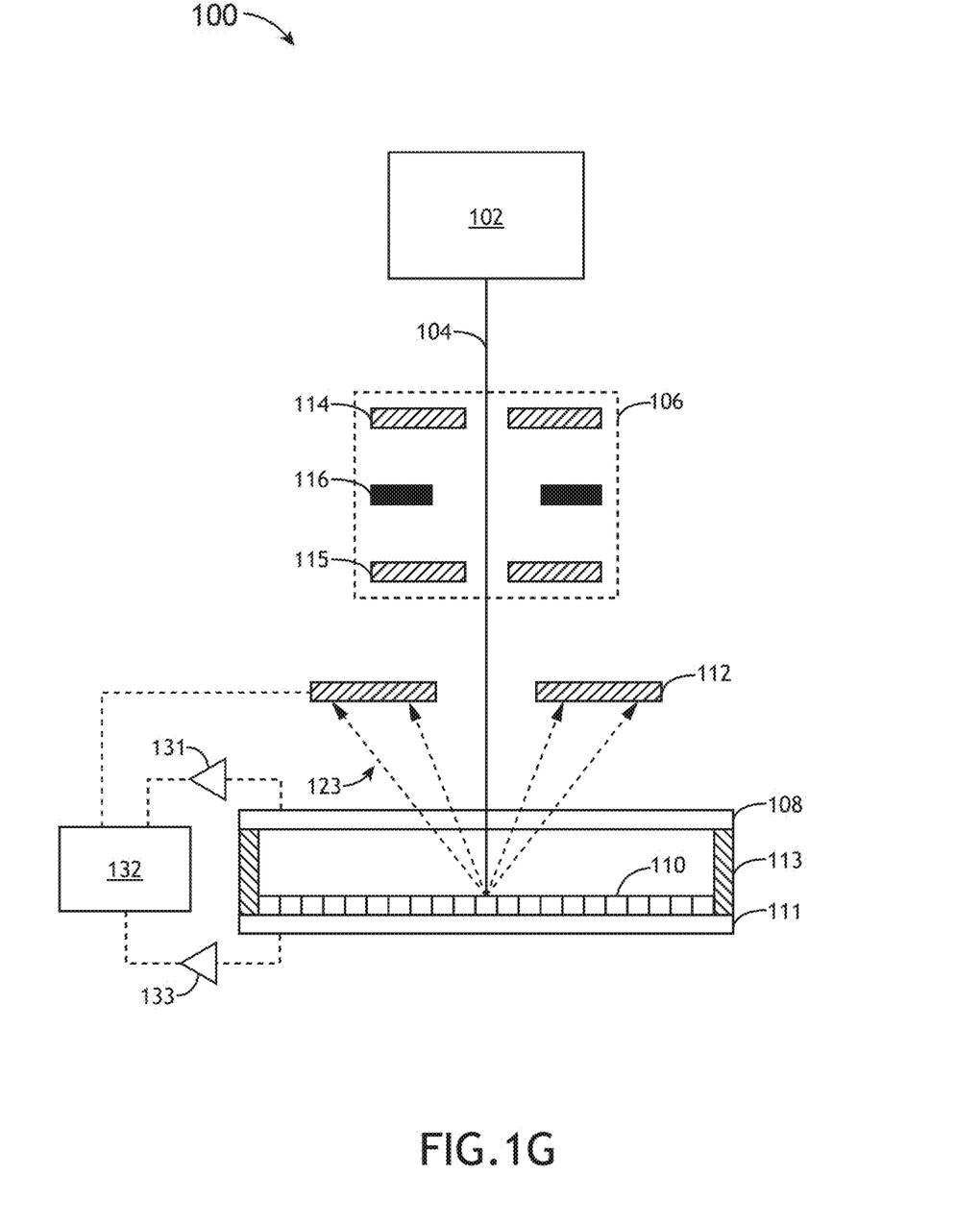
FIG. 1G is a high level schematic illustration of a system for imaging a photomask through a protective pellicle via the measurement of current in the pellicle or photomask caused by the absorption of backscattered electrons by the pellicle or photomask, in accordance with one embodiment of the present disclosure.

FIG. 1G illustrates system 100 configured for imaging the photomask 110 via the collection of backscattered electrons and/or the current signal resulting from the absorption of electrons by the pellicle 108 or photomask 110, in accordance with one embodiment of the present disclosure.

In one embodiment, the current induced in the conductive pellicle 108 by the backscattered electrons 123 absorbed by the pellicle 108 is measured. For example, the system 100 may include one or more current amplifiers 131 coupled to the pellicle 108 for amplifying the current from the pellicle 108. In this regard, as the primary beam 104 is scanned across the photomask 110 (and through the pellicle 108) the controller 132 may register an amplified output current from the pellicle 108 via amplifier 131. In turn, the controller 132 may image one or more portions of surface of the photomask 110 with the measured current, which is induced by the absorption of backscattered electrons 123 by the pellicle 108.

In another embodiment, the current induced in the conductive photomask 110 by the electrons absorbed by photomask 110 is measured. For example, the system 100 may include one or more current amplifiers 133 coupled to the photomask 110 for amplifying the current from the photomask 110. In this regard, as the primary beam 104 is scanned across the photomask 110 the controller 132 may register an amplified output current from the photomask 110 via amplifier 133. In turn, the controller 132 may image one or more portions of surface of the photomask 110 with the measured current, which is induced by the absorption of electrons (i.e., electrons not scattered by photomask) by the photomask 110.

In one embodiment, system 100 includes a controller 132. The controller 132 may be communicatively coupled to the output of the backscattered electron detector 112 and/or current amplifier 131 and/or current amplifier 133.

In another embodiment, the controller 132 may form an image of one or more portions of the photomask 110 based on a combination of the measured current from current amplifiers 131 and/or 133 and the measured backscattered electron signal from the one or more backscattered electron detectors 112. In this regard, the controller 132 may combine the signals in any manner known in the art. For instance, after calibrating the current and/or electron signals, the controller 132 may add or subtract the signals to form a composite signal. In this regard, the scattered backscattered signal and the absorbed electron signal can be combined or subtracted.

Figure 1H:
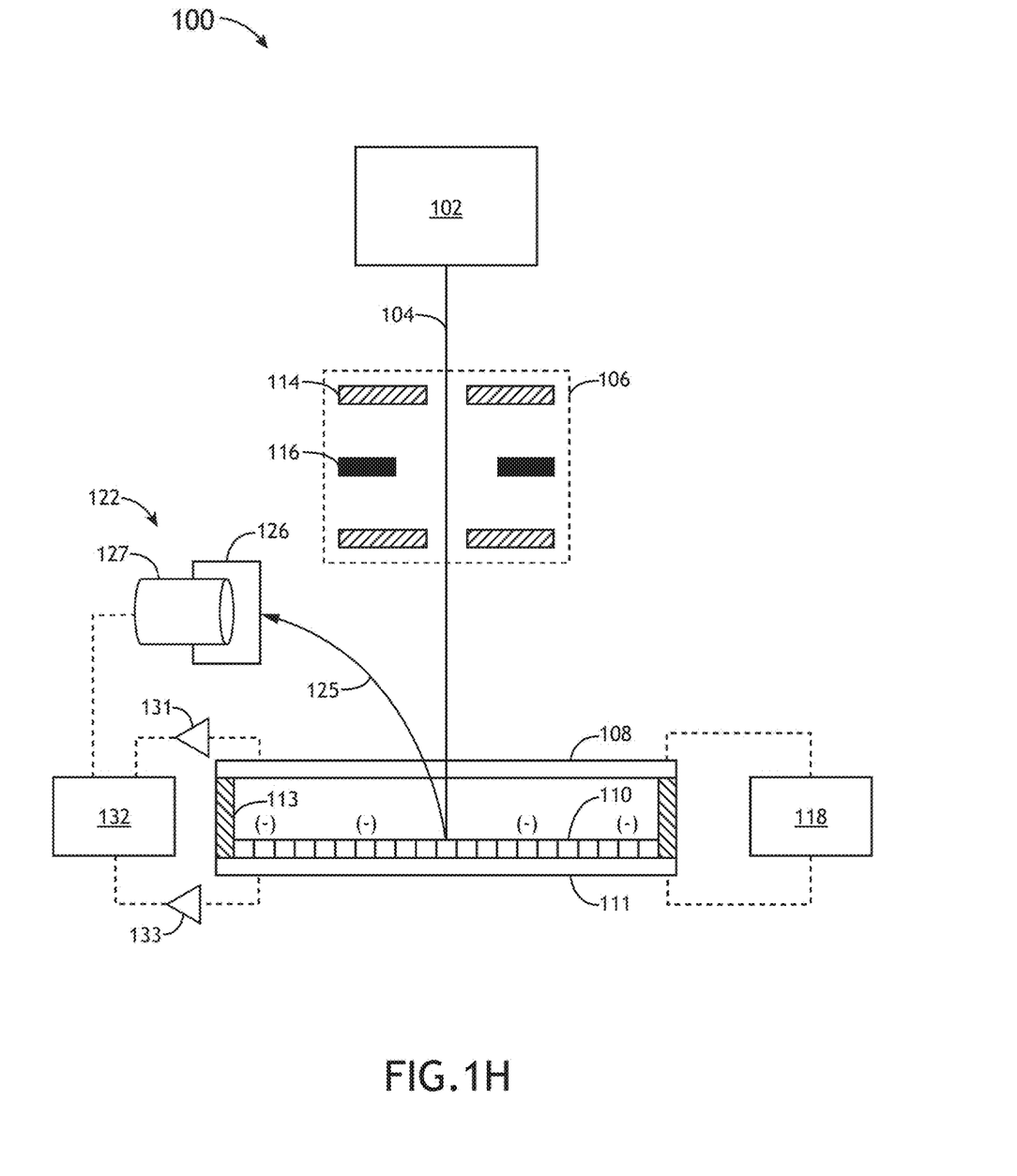
FIG. 1H is a high level schematic illustration of a system for imaging a photomask through a protective pellicle via the measurement of current in the pellicle or photomask caused by the absorption of secondary electrons by the pellicle or photomask, in accordance with one embodiment of the present disclosure.

FIG. 1H illustrates system 100 configured for imaging the photomask 110 via the collection of secondary electrons and/or the current signal resulting from the absorption of electrons by the pellicle 108 or electrons leaving photomask 110, in accordance with one embodiment of the present disclosure.

In one embodiment, the current induced in the conductive pellicle 108 by the secondary electrons 125 absorbed by the pellicle 108 is measured. For example, the one or more current amplifiers 131 coupled to the pellicle 108 may amplify the current from the pellicle 108. As the primary beam 104 is scanned across the photomask 110 the controller 132 may register an amplified output current from the pellicle 108 via amplifier 131. In turn, the controller 132 may image one or more portions of surface of the photomask 110 with the measured current, which is induced by the absorption of secondary electrons 125 by the pellicle 108.

In another embodiment, the current induced in the conductive photomask 110 due to the secondary electrons leaving the photomask 110 is measured. For example, the one or more current amplifiers 133 coupled to the photomask 110 may amplify the current from the photomask 110. As the primary beam 104 is scanned across the photomask 110 the controller 132 may register an amplified output current from the photomask 110 via amplifier 133. In turn, the controller 132 may image one or more portions of surface of the photomask 110 with the measured current, which is induced as a result of secondary electrons 125 leaving the photomask 110.

In one embodiment, system 100 includes a controller 132. The controller 132 may be communicatively coupled to the output of the secondary electron detector 122 and/or current amplifier 131 and/or current amplifier 133.

In another embodiment, the controller 132 may form an image of one or more portions of the photomask 110 based on a combination of the measured current from current amplifiers 131 and/or 133 and the measured secondary electron signal from the one or more secondary electron detectors 122. In this regard, the controller 132 may combine the signals in any manner known in the art. For instance, after calibrating the current and/or electron signals, the controller 132 may add or subtract the signals to form a composite signal.

In one embodiment, the controller 132 includes one or more processors (not shown) configured to execute program instructions suitable for causing the one or more processors to execute one or more steps described in the present disclosure. In one embodiment, the one or more processors of the controller 132 may be in communication with a carrier medium (e.g., non-transitory storage medium (i.e., memory medium)) containing the program instructions configured to cause the one or more processors of the controller 132 to carry out various steps described through the present disclosure. It should be recognized that the various processing steps described throughout the present disclosure may be carried out by a single computing system or, alternatively, a multiple computing system. The controller 132 may include, but is not limited to, a personal computer system, mainframe computer system, workstation, image computer, parallel processor, or any other device known in the art. In general, the term "computer system" may be broadly defined to encompass any device having one or more processors, which execute instructions from a memory medium. Moreover, different subsystems of the system 100 may include a computer system or logic elements suitable for carrying out at least a portion of the steps described above. Therefore, the above description should not be interpreted as a limitation on the present disclosure but merely an illustration.

Figure 1I:
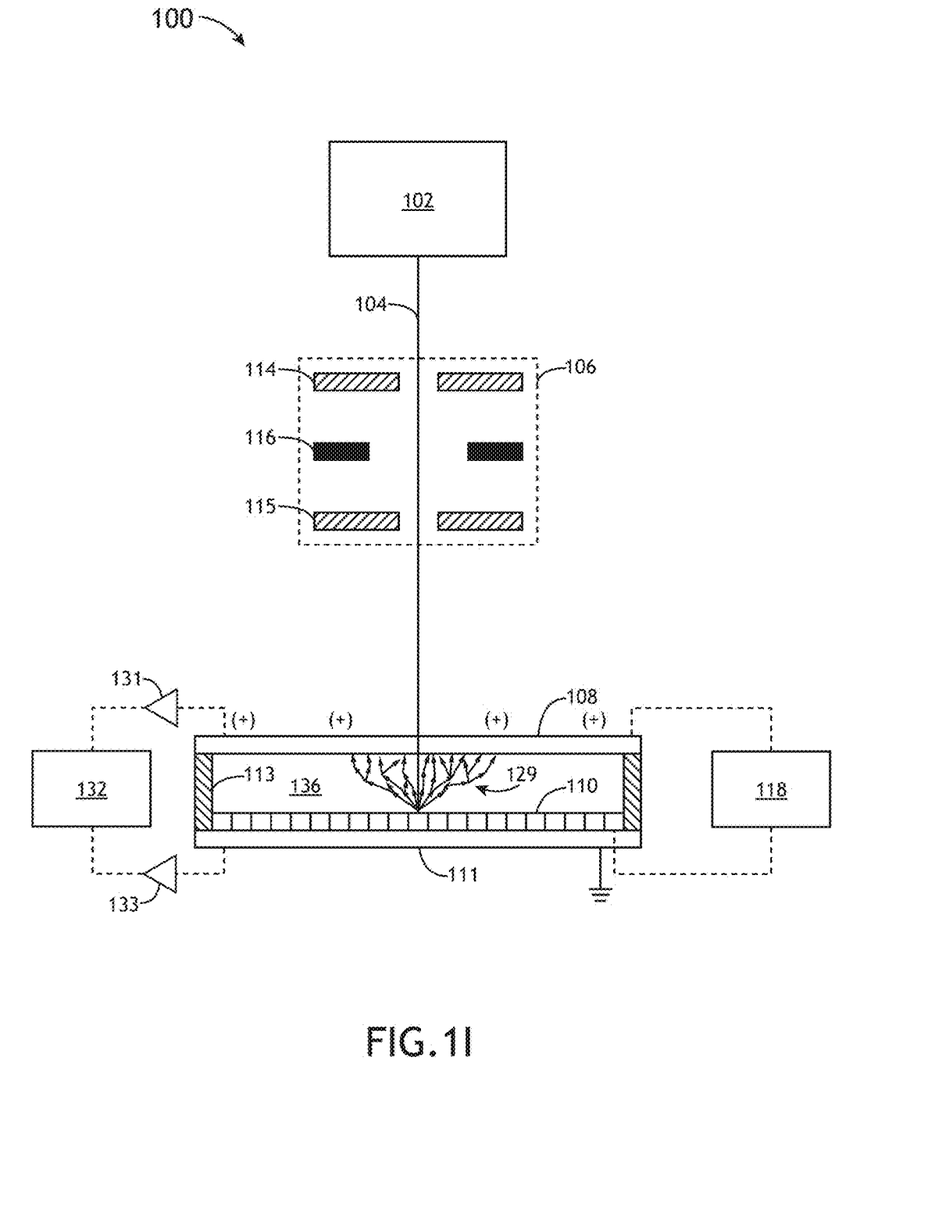
FIG. 1I is a high level schematic illustration of a system for imaging a photomask through a protective pellicle via the measurement of the gas cascade amplified secondary electrons absorbed by the pellicle or the measurement of the gas cascade secondary electrons leaving the photomask, in accordance with one embodiment of the present disclosure.
Figure 1J:
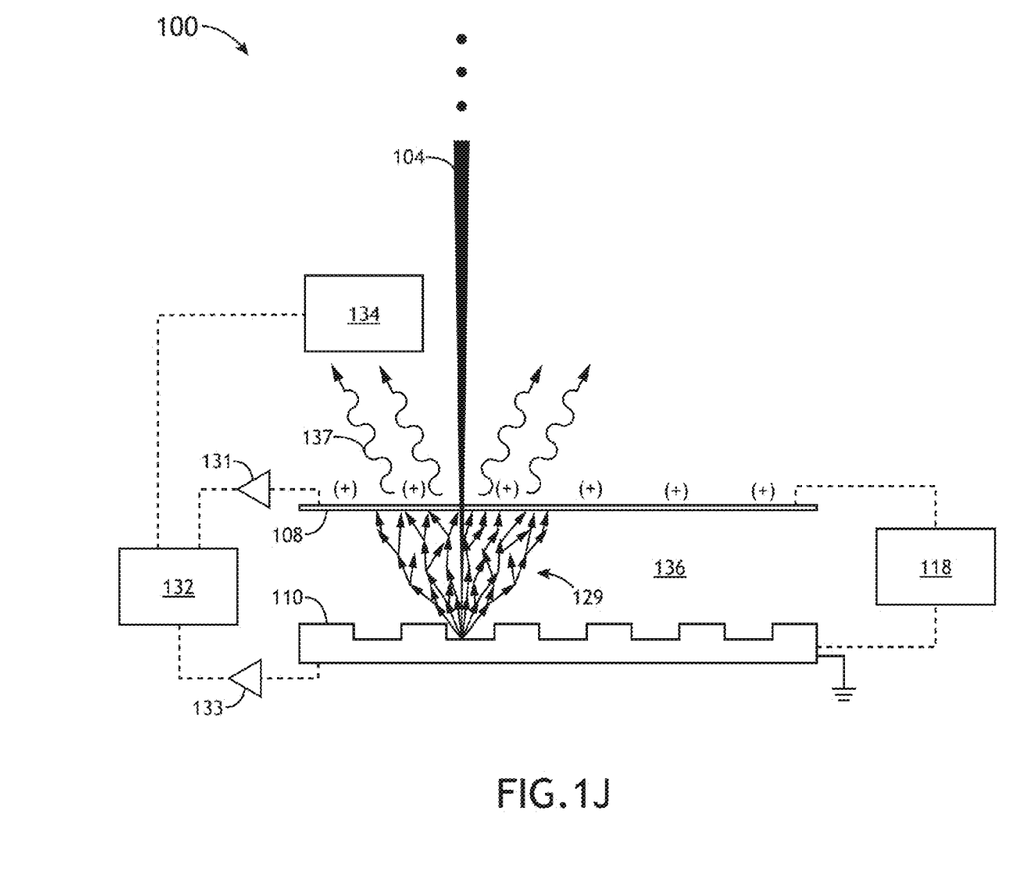
FIG. 1J is a high level schematic illustration of a system for imaging a photomask through a protective pellicle via the measurement of the gas cascade amplified secondary electrons absorbed by the pellicle, the measurement of the gas cascade secondary electrons leaving the photomask or the collection of photons resulting from electron-gas interactions in a pressurized gas medium, in accordance with one embodiment of the present disclosure.

FIGS. 1I-1J illustrate system 100 configured for imaging a photomask protected by a pellicle via the collection of an amplified electron signal resulting from the gas amplification of initial secondary electrons, in accordance with an additional embodiment of the present disclosure. It is noted that the secondary electrons initially emitted by the photomask 110 may have low voltage (e.g., 3-5 eV) and, thus, have insufficient energy for absorption by the pellicle 108.

In one embodiment, a pressurized gas medium 136 is maintained with the volume between the pellicle 108 and photomask 110. The pressurized gas medium 136 serves to amplify weak initial secondary electrons emitted by the surface of the photomask 110 via an electron cascade process. In this regard, after the primary electron beam 104 (e.g., energy of 5 to 200 kV) impinges on the surface of the photomask 110, the photomask 110 emits initial secondary electrons. In turn, these initial secondary electrons interact with the pressurized gas medium 136 (i.e., electrons collide with gas molecules) and emit additional electrons (and photons). This process is repeated in a cascading process, resulting in a secondary electron signal significantly larger than the initial secondary electron signal. An amplification factor of 10,000 may be achieved. The pressurized gas medium 136 may include any gas suitable for sustaining ionization and the cascading of electrons. In addition, it is desirable to minimize the amount of organic material present in the pressurized gas medium 136. The pressurized gas medium 136 may include, but is not limited to, $H_2O$, $O_2$, $H_2$, $O_3$ or $N_2$. Further, the pressurized gas medium 136 may be held at a pressure between 0.1 and 10 Torr. It is further noted that the ionizing medium created by the electron-gas interactions may serve as a cleaning agent to clean and/or maintain the cleanliness of the photomask 110.

In another embodiment, an accelerating voltage is established between the pellicle 108 and the photomask 110. In one embodiment, the accelerating voltage is established by positively biasing the pellicle 108 relative to the photomask 110. For example, the photomask 110 may be grounded, with the pellicle 108 held at a positive potential. For example, as shown in FIGS. 1I and 1J, the bias control circuitry 118 may connect the photomask 110 to ground, while establishing a positive potential on the pellicle 108 (e.g., via a voltage source). The bias control circuitry 118 may be integrated with the sample stage 111 to establish one or more electrical connections between the sample stage 111 and the pellicle 108 and/or photomask 110 in order to ground the photomask 110, while providing a positive potential to the pellicle 108. The acceleration voltage serves to accelerate the gas amplified cascade electrons 129 toward the pellicle 108, which causes increased absorption of the gas amplified cascade electrons 129 by the pellicle 108.

It is noted that the pellicle 108 may be biased with any voltage suited for generating an adequate gas amplified cascade electron signal at the pellicle 108. For example, the pellicle 108 may be biased with a voltage between +0.1 V and 1000 V.

In another embodiment, the current induced in the conductive pellicle 108 by the gas amplified cascade electrons 129 is measured. For example, the system 100 may include one or more current amplifiers 131 coupled to the pellicle 108 for amplifying the current from the pellicle 108. In this regard, as the primary beam 104 is scanned across the photomask 110 (and through the pellicle 108) the controller 132 may register an amplified output current from the pellicle 108 via amplifier 131. In turn, the controller 132 may image one or more portions of surface of the photomask 110 with the measured current, which is induced by the absorption of gas amplified cascade electrons by the pellicle 108.

In another embodiment, the current induced in the conductive photomask 110 due to the gas amplified cascade electrons 129 leaving the photomask 110 is measured. For example, the system 100 may include one or more current amplifiers 133 coupled to the photomask 110 for amplifying the current from the photomask 110. In this regard, as the primary beam 104 is scanned across the photomask 110 the controller 132 may register an amplified output current from the photomask 110 via amplifier 133. In turn, the controller 132 may image one or more portions of surface of the photomask 110 with the measured current, which is when the gas amplified cascade electrons leave the photomask 110.

In another embodiment, as shown in FIG. 1J, the system 100 includes one or more light detectors 134. The one or more light detectors 134 are situated to collect photons emitted from the gas medium 136, which result from the electron-gas interaction. For example, the one or more light detectors 134 may include, but are not limited to, a photomultiplier tube or an avalanche photodetector. In another embodiment, the controller 132 is communicatively coupled to the one or more light detectors 134 and is configured to receive one or more signals indicative of the measured photon signal from the one or more light detectors 134. In turn, the controller 132 may image one or more portions of the surface of the photomask 110 using the received photon signal from the one or more light detectors 134.

In another embodiment, the controller 132 may form an image of one or more portions of the photomask 110 based on a combination of the measured current from current amplifiers 131 and/or 133 and the measured photon signal from the one or more light detectors 134. In this regard, the controller 132 may combine the signals in any manner known in the art. For instance, after calibrating the current and/or light signals, the controller 132 may add or subtract the signals to form a composite signal.

The use of a gas medium to enhance SEM detection is described generally in U.S. Pat. No. 4,992,662 to Danilatos, issued on Feb. 12, 1991, which is incorporated herein by reference in the entirety. The use of a gas medium to enhance SEM detection is also described in U.S. Pat. No. 5,362,964 to Knowles et al., issued on Nov. 8, 1994, which is incorporated herein by reference in the entirety.

The embodiments of the system 100 illustrated in FIGS. 1A-1J may be further configured as described herein. In addition, the system 100 may be configured to perform any other step(s) of any of the method embodiment(s) described herein.

Figure 2:
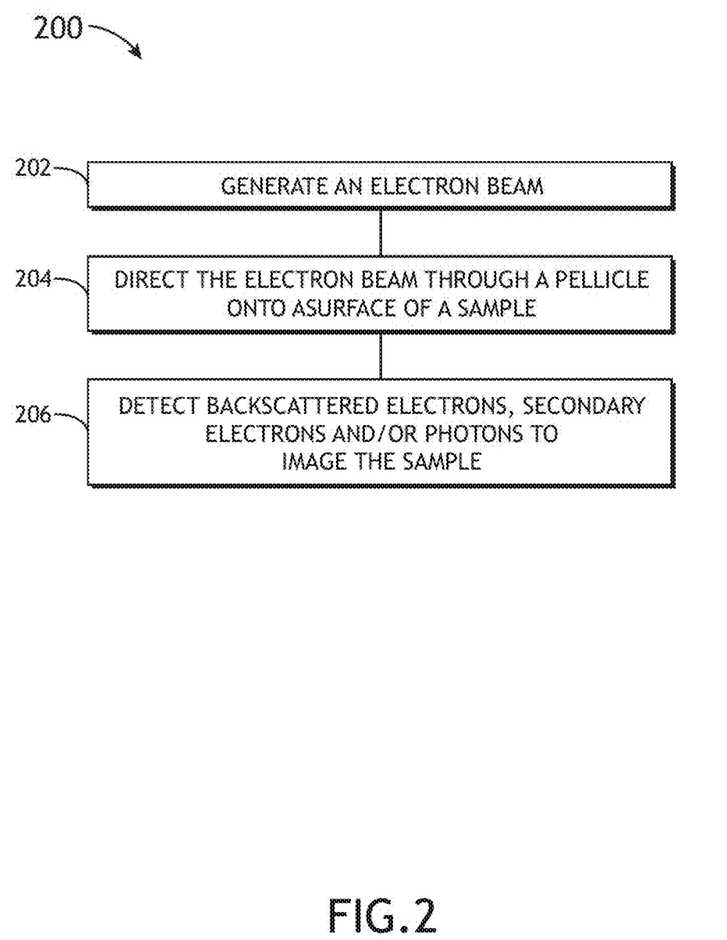
FIG. 2 is a process flow diagram illustrating a method for imaging one or more portions of a photomask through a protective pellicle, in accordance with one embodiment of the present disclosure.

FIG. 2 is a flow diagram illustrating steps performed in a method for imaging a sample through a protective pellicle. It is recognized that steps of the process flow 200 may be carried out via one or more embodiments of system 100. It should be, however, be recognized by those skilled in the art, that the system 100 should not be interpreted as a limitation on process 200 as it is contemplated that a variety of system configurations may carry out process flow 200.

In a first step 202, an electron beam is generated. For example, as shown in FIG. 1A, an electron beam 104 may be generated using an electron beam source 102.

In a second step 204, the electron beam is directed through a pellicle onto a surface of a sample. For example, as shown in FIGS. 1A-1J, the electron-optical elements of the electron-optical column 106 direct the beam 104 through the pellicle 108 and onto the surface of the sample, such as, but not limited to, the photomask 110.

In a third step 206, the backscattered electrons, secondary electrons and/or photons that are transmitted back through the pellicle 108 are detected. For example, as shown in FIG. 1A, backscattered electrons 123 may scatter from the surface of the photomask 110 and traverse the pellicle 108. After the backscattered electrons 123 are transmitted through the pellicle 108, one or more backscattered electron detectors 112 may collect the backscattered electrons. Controller 132 may use the collected backscattered electron signal to image one or more portions of the surface of the photomask 110.

By way of another example, as shown in FIG. 1E, secondary electrons 125 may be emitted from the surface of the photomask 110 and traverse the pellicle 108. After the secondary electrons 125 are transmitted through the pellicle 108, one or more secondary electron detectors 122 may collect the secondary electrons 125. Controller 132 may use the collected secondary electron signal to image one or more portions of the surface of the photomask 110.

By way of another example, as shown in FIGS. 1I and 1J, initial "weak" secondary electrons may be emitted from the surface of the photomask 110 and amplified/multiplied by the pressurized gas medium 136. The electrons generated by gas amplification may then impinge the pellicle 108 or be absorbed by the photomask 110 itself. After the electrons generated by gas amplification are absorbed by the pellicle 108 and/or emitted by the photomask 110, the current is measured (e.g., via current amplifiers 131 and/or 133 and controller 132). Controller 132 may use the measured current associated with electrons absorbed by the pellicle 108 and/or the electrons leaving the photomask 110 to image one or more portions of the surface of the photomask 110.

By way of another example, as shown in FIG. 1J, photons 137 may be emitted from the gas medium 136 as a result of electron-gas interactions. After the photons 137 generated by electron-gas interactions are transmitted through the optically transparent pellicle 108, one or more light detectors 134 (e.g., one or more photomultiplier tubes) may collect the photons 137. Controller 132 may use the collected photon signal to image one or more portions of the surface of the photomask 110.

It is further noted that the method 200 and system 100 may use any combination of the various detection modes described herein to image the sample. For example, in the case of gas amplification, the controller 132 may form an image of one or more portions of the photomask 110 based on a combination of the measured current signal from current amplifiers 131 and/or 133 and the measured photon signal from the one or more light detectors 134. In this regard, the controller 132 may combine the signal in any manner known in the art. For instance, after calibrating the current and/or light signals, the controller 132 may add or subtract the signals to form a composite signal. It is further noted that the measured current signal from amplifier 131 and/or amplifier 133 may also be combined with the backscattered electron measurements from the backscattered electron detector 112 (see FIG. 1G) and/or the secondary electron measurements from the secondary electron detector 122 (see FIG. 1H).

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A scanning electron microscopy apparatus comprising:
   an electron beam source configured to generate an electron beam;
   a sample stage configured to secure a sample and a pellicle, wherein the pellicle is disposed above the sample and the sample is negatively biased relative to the pellicle;
   an electron-optical column including a set of electron-optical elements to direct at least a portion of the electron beam through the pellicle and onto a portion of the sample; and
   a detector assembly positioned above the pellicle and configured to detect electrons emanating from the surface of the sample.

2. The apparatus of claim 1, wherein the electron beam source comprises:
   one or more electron guns.

3. The apparatus of claim 1, wherein the sample comprises:
   a photomask.

4. The apparatus of claim 3, wherein the sample comprises:
   at least one of an extreme ultraviolet photomask or an X-ray photomask.

5. The apparatus of claim 1, wherein at least one of the pellicle or sample is conductive.

6. The apparatus of claim 1, wherein the detector assembly comprises:
   one or more backscattered electron detectors.

7. The apparatus of claim 6, wherein the detector assembly comprises:
   an array of backscattered electron detectors.

8. The apparatus of claim 1, wherein the detector assembly comprises:
   one or more secondary electron detectors.

9. The apparatus of claim 8, wherein the detector assembly comprises:
   an Everhart-Thornley secondary electron detector.

10. The apparatus of claim 8, wherein the detector assembly comprises:
    a secondary electron detector disposed within the electron-optical column.

11. The apparatus of claim 8, wherein the detector assembly comprises:
    a multi-channel electron multiplier detector.

12. The apparatus of claim 1, further comprising:
    bias control circuitry to control the potential on at least one of the pellicle or sample.

13. The apparatus of claim 12, wherein the bias control circuitry establishes the negative bias on the sample relative to the pellicle.

14. The apparatus of claim 12, wherein the bias control circuitry is integrated with the sample stage to establish one or more electrical connections between the sample stage and at least one of the pellicle or the sample in order to ground at least one of the pellicle or the sample.

15. The apparatus of claim 1, further comprising:
    a controller communicatively coupled to the detector assembly and configured to form one or more images of the surface of the sample based on one or more signals from the detector assembly.

16. A scanning electron microscopy apparatus comprising:
    an electron beam source configured to generate an electron beam;
    a sample stage configured to secure a sample and a pellicle, wherein the pellicle is disposed above the sample, wherein a selected gas is contained within the volume between the pellicle and the sample at a selected pressure; and
    an electron-optical column including a set of electron-optical elements to direct at least a portion of the electron beam through the pellicle and onto a portion of the sample,
    wherein the selected gas amplifies electrons emanating from the surface of the sample.

17. The apparatus of claim 16, wherein the selected gas comprises:
    at least one of $H_2O$, $O_2$, $H_2$, $O_3$ or $N_2$.

18. The apparatus of claim 16, wherein the selected pressure is between 0.1 to 10 Torr.

19. The apparatus of claim 16, further comprising:
    bias control circuitry to control the potential on at least one of the pellicle or sample.

20. The apparatus of claim 19, wherein the bias control circuitry establishes a positive bias on the pellicle relative to the sample.

21. The apparatus of claim 19, wherein the bias control circuitry is integrated with the sample stage to establish one or more electrical connections between the sample stage and at least one of the pellicle or the sample in order to ground at least one of the pellicle or the sample.

22. The apparatus of claim 16, further comprising:
    a controller electrically coupled to at least one of the pellicle or the sample and configured to receive a current output from at least one of the pellicle or the sample representative of the electrons absorbed by at least one of the pellicle or the sample.

23. The apparatus of claim 22, further comprising:
one or more light detectors disposed above the pellicle and configured to detect photons emitted from the gas contained within the volume between the pellicle and the photomask.

24. The apparatus of claim 23, wherein the controller is configured to receive one or more signals from the one or more light detectors indicative of the detected photons from the gas contained within the volume between the pellicle and the photomask.

25. The apparatus of claim 24, wherein the controller is configured to image one or more portions of the sample based on at least one of the received current output from at least one of the pellicle or the sample or the one or more received signals from the one or more light detectors.

26. A method for imaging a sample through a pellicle comprising:
generating an electron beam;
directing the electron beam through a pellicle onto a surface of a sample, wherein the sample is negatively biased relative to the pellicle; and
detecting at least one of backscattered electrons scattered from the surface of the sample, secondary electrons emitted from the surface of the sample, or photons emitted by electron-gas interactions within a pressurized gas between the pellicle and the sample.

* * * * *